(12) United States Patent
Agnew et al.

(10) Patent No.: US 8,076,591 B2
(45) Date of Patent: Dec. 13, 2011

(54) CIRCUIT BOARDS

(75) Inventors: Martin Joseph Agnew, Stanstead (GB); Gary David Panaghiston, Ramsden Heath (GB); Murray Jerel Niman, Chelmsford (GB); Nicholas Chandler, Maldon (GB)

(73) Assignee: BAE Systems plc, London (GB)

( * ) Notice: Subject to any disclaimer, the term of this patent is extended or adjusted under 35 U.S.C. 154(b) by 1197 days.

(21) Appl. No.: 11/794,652

(22) PCT Filed: Dec. 22, 2005

(86) PCT No.: PCT/GB2005/050260
§ 371 (c)(1),
(2), (4) Date: Jul. 2, 2007

(87) PCT Pub. No.: WO2006/070206
PCT Pub. Date: Jul. 6, 2006

(65) Prior Publication Data
US 2009/0279274 A1 Nov. 12, 2009

(30) Foreign Application Priority Data
Dec. 31, 2004 (GB) .................................. 0428591.2

(51) Int. Cl.
*H01B 17/04* (2006.01)
(52) U.S. Cl. ..................... 174/350; 174/255; 361/816
(58) Field of Classification Search .............. 174/254, 174/350; 361/800, 816
See application file for complete search history.

(56) References Cited

U.S. PATENT DOCUMENTS

| 3,579,206 | A | * | 5/1971 | Grange ........................ 365/160 |
| 4,980,659 | A | | 12/1990 | Allard et al. |
| 5,499,442 | A | | 3/1996 | Nakamura et al. |
| 5,631,446 | A | * | 5/1997 | Quan ............................. 174/254 |
| 5,808,529 | A | | 9/1998 | Hamre et al. |
| 5,924,873 | A | * | 7/1999 | Barcley et al. .................. 439/67 |
| 6,055,722 | A | | 5/2000 | Tighe et al. |
| 6,501,181 | B2 | | 12/2002 | Albinsson |
| 7,209,361 | B2 | * | 4/2007 | Berberich et al. ............ 361/760 |
| 2003/0116776 | A1 | | 6/2003 | Oppermann |

OTHER PUBLICATIONS

International Search Report, Mar. 20, 2006, from PCT International Patent Application No. PCT/GB2005/050260, filed Dec. 22, 2005.
European Patent Office, International Preliminary Report on Patentability and Written Opinion, Jul. 12, 2007, from International Patent Application No. PCT/GB2005/050260, filed on Dec. 22, 2005.

* cited by examiner

*Primary Examiner* — Ishwarbhai Patel
(74) *Attorney, Agent, or Firm* — Kenyon & Kenyon LLP

(57) ABSTRACT

The invention relates to circuit boards and to screening circuits and components on such boards from stray rf interference when they are mounted as arrays or stacks of such circuit boards. The circuit boards (12, 14) are individually screened by conductive screening layers (16, 18) as known in the art and the individual screening layers are coupled together by layered interconnects (34) which connect corresponding screening layers (16, 18) of the individual circuit boards (12, 14) together, instead of by vias.

19 Claims, 7 Drawing Sheets

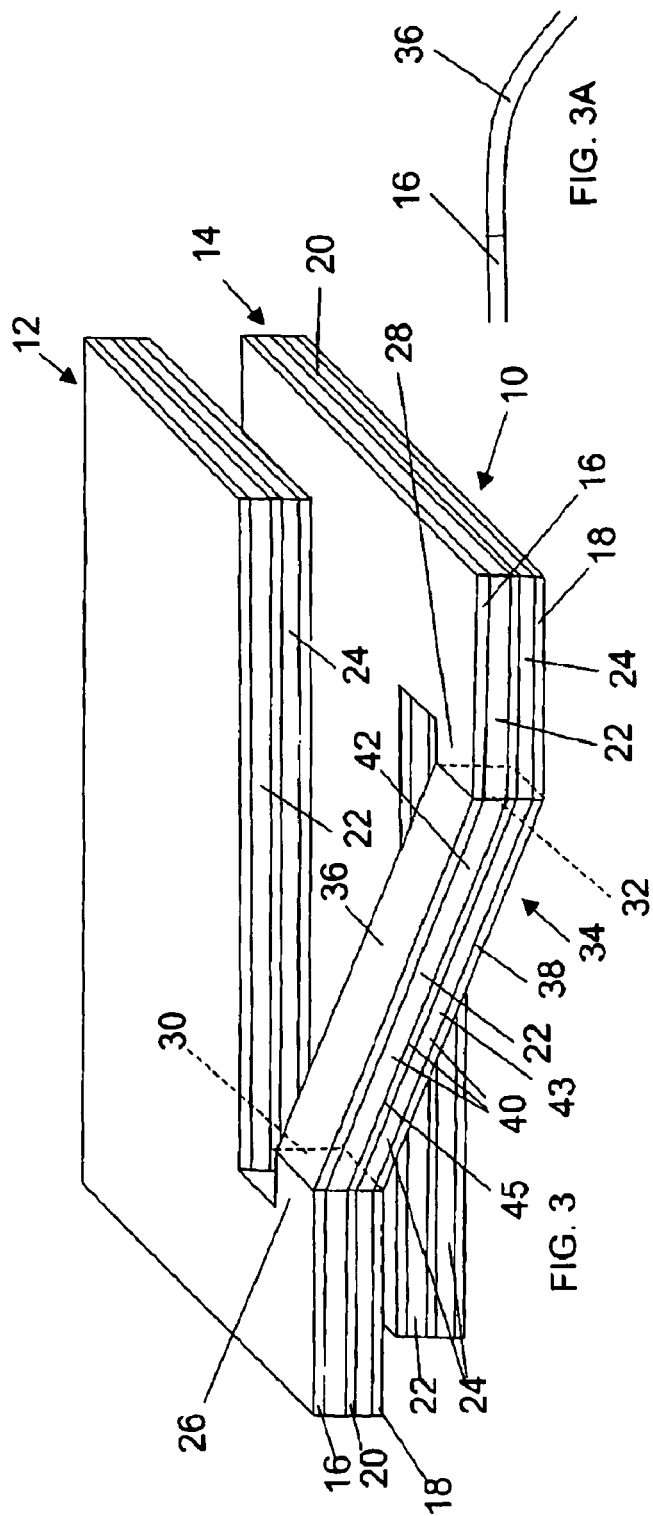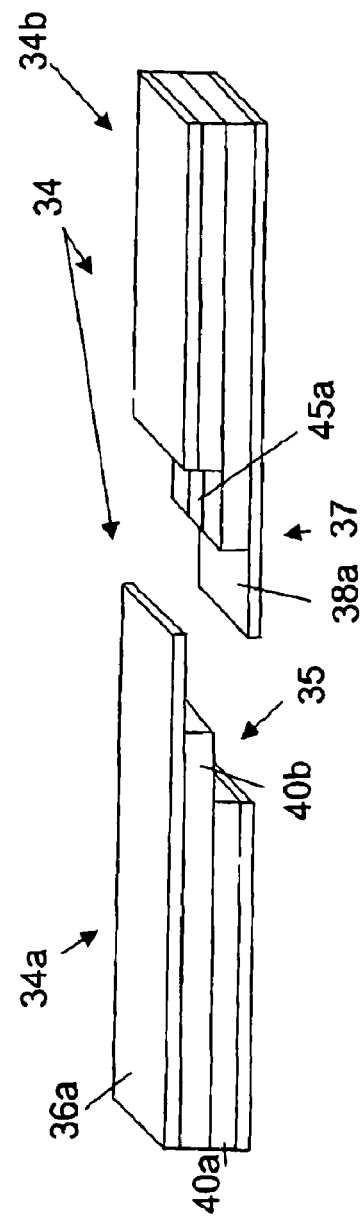
FIG. 3
FIG. 3A
FIG. 4

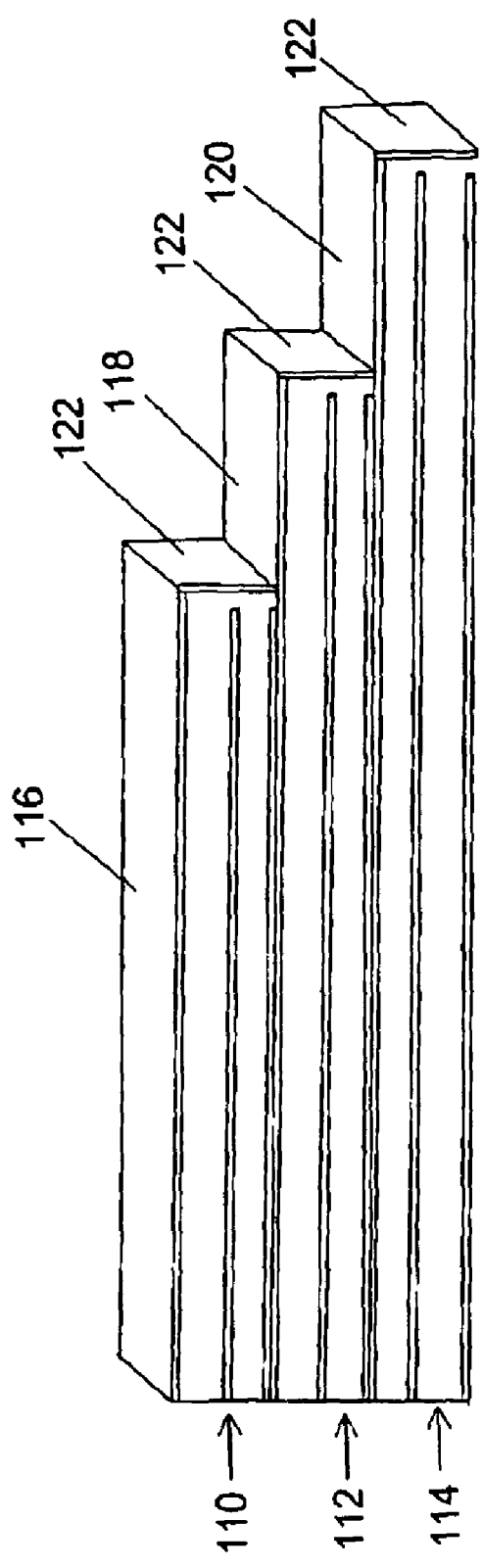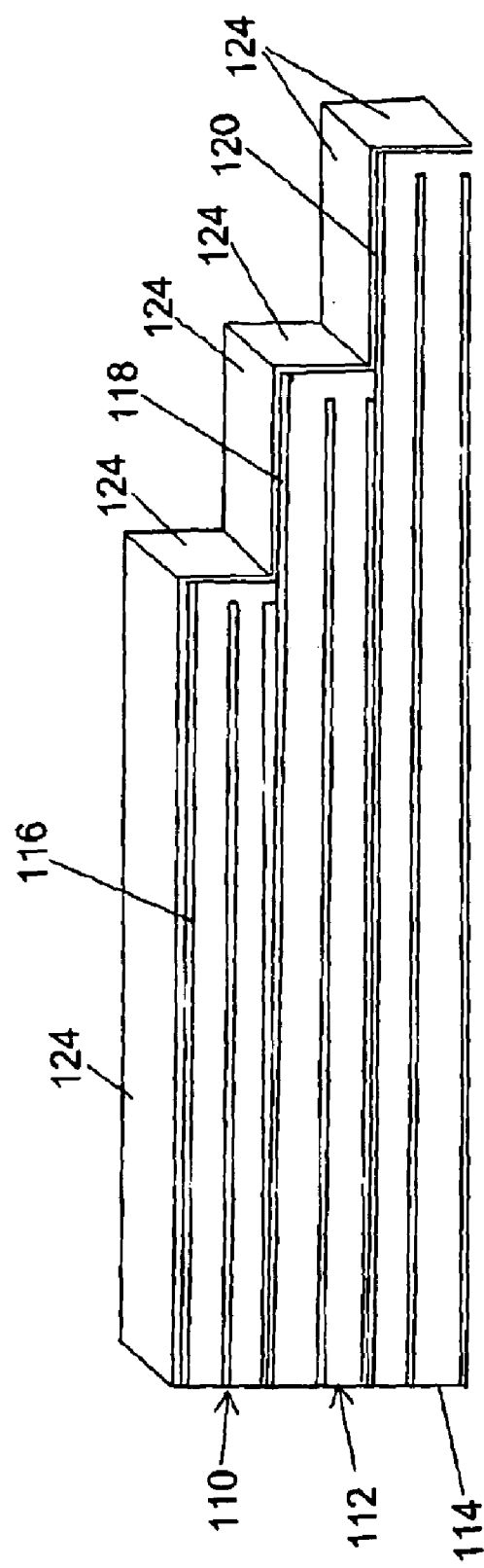

CIRCUIT BOARDS

RELATED APPLICATION INFORMATION

This application is a United States National Phase Patent Application of, and claims the benefit of, International Patent Application No. PCT/GB2005/050260 which was filed on Dec. 22, 2005, and which claims priority to British Patent Application No. 0 428 591.2, which was filed in the British Patent Office on Dec. 31, 2004, the disclosures of which are hereby incorporated by reference.

FIELD OF THE INVENTION

The present invention is concerned with circuit boards, in particular with printed circuit boards (PCB) and with circuit boards comprising other types of conductive layer, and with units comprising same. While circuit boards according to the present invention may be used in particular with signal frequencies in the range 500 MHz to 80 GHz, the exemplary embodiments and/or exemplary methods of the present invention may be applied for use in high speed digital circuits and with millimetric wavelength signals of up to 300 GHz, with appropriate choice of materials.

BACKGROUND INFORMATION

Printed circuits, in particular, are susceptible to interference by radio frequency (rf) emissions and particularly so when they are coupled together either in side-by-side or stacked relationship. In order to screen the components of PCBs from for example radio interference, PCBs are typically mounted, or 'sandwiched' between screening layers formed of conductive material which is maintained at ground potential, thereby to form a multilayer or composite PCB unit.

Typical arrangements of two PCB structures, each comprising a plurality of such multilayer PCB units in a stacked arrangement, are shown in FIGS. 1 and 2 of the accompanying drawings which illustrate isometric views of the arrangements.

In FIGS. 1 and 2, the arrangement in each figure comprises four PCB units 1, 2, 3, 4 mounted in a stack and coupled physically and electrically by vias 5 while maintained in spaced relationship by intervening layers of insulating material 6. The vias 5 provide electrical connection between corresponding layers of the PCB units to ensure that electrical communication can be maintained between them and the components thereof, according to the circuit design, thus to ensure that a uniform potential can be maintained where necessary, i.e. ground potential.

However, it has been observed that the use of vias does permit noise and crosstalk between the interconnected layers due to the vias acting as antennae at radio frequencies.

In our co-pending UK patent application no. GB 0326229.2, there is disclosed an interconnect for electrically connecting striplines or multilayer PCBs, which interconnect is formed as a sandwich of dielectric material held between two ground planes with a strip conductor extending through the dielectric and having an input portion and an output portion. The sandwich is formed by two pieces of dielectric material, each piece being backed by a ground plane and the two pieces of dielectric material being brought together in overlapping relationship.

The arrangement disclosed in the aforesaid application addresses to some extent the band-limiting characteristics of plated-through apertures and over-the-edge connections of the then prior art, which affected the performance of the PCB circuits and gave rise to some signal radiation.

SUMMARY OF THE INVENTION

The present invention provides, in one aspect, a circuit board structure comprising:
  a first multilayered circuit board unit;
  a second multilayered circuit board unit,
  each multilayered circuit board unit comprising a first outer screening layer and a layer comprising a circuit board; and
  an interconnect providing an electrical connection between the first and second circuit board units, the interconnect comprising a laminate having a first electrically conductive layer and a further layer, the first electrically conductive layer electrically connecting the first outer screening layer of each of the first and second multilayered circuit board units.

From this first aspect the circuit board units within the structure may each be provided with only one outer screening layer. Preferably the outer screening layers of the first and second circuit board units are mounted on opposite sites of the respective circuit board layers so that when assembled in the circuit board structure the first and second layers of circuit board may be disposed between two outer screening layers.

In a circuit board structure according to the present invention, the circuit board units may themselves be spaced apart.

In a circuit board structure according to the present invention, the interconnect may comprise an electrical connection for electrically connecting components of the circuit boards of the first and second circuit board units, the electrical connection being provided either within the further layer or mounted thereon. The interconnect in this case is essentially a section of microstrip or "buried" microstrip. Alternatively the further layer may simply be an insulating layer serving primarily to maintain a spaced relationship between electrically conductive layers.

In a preferred embodiment, in the circuit board structure according to the first aspect of the present invention: each of said first and second circuit board units further comprise a second outer screening layer such that the layer comprising a circuit board is disposed between the first and second outer screening layers; the interconnect is a laminate further comprising a second electrically conductive layer such that the further layer forms an intermediate layer disposed between the first and second electrically conductive layers; and the second electrically conductive layer electrically connects the second outer screening layer of each of the first and second multilayered circuit board units.

Where there is a requirement for electrically coupling a circuit or circuits of one circuit board unit to circuits of the adjacent circuit board unit, or simply to maintain parts of the circuits of the adjacent circuit board units at the same potential, this can be achieved by providing a conductive layer or strip in the intermediate layer of the interconnect. To this end, the intermediate layer is then preferably formed as two strata of insulating material that either enclose a conductive strip or sandwich a conductive layer therebetween, while permitting electrical contact to be made therewith.

The screening layers of each circuit board unit and the first and second layers of the interconnect are provided primarily to screen circuits of the circuit boards from radio interference though may also serve to screen those same circuits from other external interference or influences, such as magnetic fields.

The first and, preferably, the second layers of the interconnect are of planar form such that, when connected to the first and, preferably, second rf screening layers of the circuit board units, they can form a continuous outer surface with those first and second outer rf screening layers.

The circuit board units themselves can be mounted in various positions relative to each other. In a first arrangement of a structure according to the invention, the first circuit board unit can be superimposed partially or wholly over the second circuit board unit with the interconnect bonded to both units. A preferred arrangement is one in which one unit is positioned vertically over the other with the two units in parallel relationship, which may be a spaced relationship.

The two units may be of the same or similar dimensions as to length and width so that when positioned one above the other, their respective edges are vertically aligned. For ease of construction, with the two units arranged one above the other, it is advantageous that respective portions of two edges are vertically aligned. With such an arrangement, the interconnect is then mountable alongside the vertically aligned edge portions and spaced therefrom. The circuit board units may each be provided with a tab portion so positioned that the interconnect can extend between them. In one preferred example, the tab portions are formed at opposite end regions of respective aligned edge portions with the interconnect extending between them.

The interconnect itself may be in the form of an inclined ramp extending between the tab portions. Alternatively it may be formed as a series of ramps with a section between successive ramps that is parallel to the planes of the circuit board units. It will be appreciated that a number of variants may be considered. It has been observed however, that, no matter the manner in which the interconnect is formed, optimum results are obtained where the interconnect has continuous outer surfaces, uninterrupted by fold lines, creasing and the like. This continuity applies also, as described below, to the connection of the electrically conductive layers of the interconnect with the respective screening layers of the circuit board units. To avoid fold lines and creases, the interconnect may be formed to provide curved or bent layers that can be aligned with the outer screening layers of the circuit board units so that the outer surfaces thereof can be continuous with the outer surfaces of the respective outer screening layers of the circuit board units. To permit provision of curved surfaces by the interconnect, the conductive layers of the interconnect and the strata providing the intermediate layer, and also the conductive strip or layer embedded therein may be provided by flexible materials, or by materials that can be rendered flexible by the application of heat.

For ease of convenience, an interconnect is advantageously mounted externally of the circuit board units that it electrically connects. However, space is frequently a consideration in locating and mounting circuit board units and it is therefore considered to be useful to provide the interconnect within the confines determined by the dimensions of the circuit board units themselves. Accordingly each circuit board unit of a structure according to the present invention may be formed with an aperture or recess therein, with the apertures or recesses aligned when circuit board units are stacked one upon the other or in side-by-side relationship; each aperture or recess may then have an edge portion opposite to that of an adjacent circuit board unit so that the interconnect can be electrically connected to the units and extend from one edge portion to another, and within the overall confines of the stack of circuit board units.

It will be readily appreciated that provision for attaching an interconnect between circuit board units can be made when forming the boards and circuit board units comprising those boards, where these are intended to be mounted in side-by-side or stacked relationship.

The interconnect itself can be formed as a single part or as a plurality of interconnect segments. In either form, end portions of the single part or of each segment are preferably stepped so that the layers of the interconnect can be abutted with complimentarily formed edge portions of the circuit board units with which they engage, prior to bonding, and/or with each other where the interconnect is itself formed of a plurality of segments.

The interconnect is ideally bonded to the first and second circuit board units by a suitable bonding agent so that the first and second layers of the interconnect are electrically connected to the respective first and second screening layers of the first and second circuit board units, the bonding agent being electrically conductive and sufficiently robust, when necessary, to withstand for example, impact or severe vibration. Suitable bonding agents include solders, solder-based adhesives and other electrically-conductive materials such as epoxy resins containing for example tin, silver, gold or carbon as filler material. In environments where robust treatment is not anticipated, other materials for example electrically-conductive adhesive tape may be used.

Of course, the same bonding techniques may be applied whether the circuit board units included within the circuit board structure have one or two outer screening layers and hence whether the interconnect provides electrically conductive layers for linking one or two outer screening layers of such circuit board units.

Where the layers comprising a circuit board of adjacent circuit board units are desired to be electrically connected, and the intermediate layer of the interconnect includes a conductive strip or layer, a similar adhesive material to that described in the immediately preceding paragraph may be used for connecting the conductive strip or layer to the circuit boards.

In any structure provided by the present invention, it is contemplated that the first and second screening layers of each circuit board unit are spaced from and electrically insulated from the circuit boards themselves and from electrical and electronic components thereon. This insulation may be achieved simply by the spatial separation itself but it is preferred that such insulating material comprises for example epoxy resin material between the circuit board and the screening layers.

The present invention provides in another aspect a circuit board structure comprising three or more multilayered circuit board units, each of which comprises first and second outer screening layers and a circuit board located between the first and second outer screening layers and insulated therefrom, and an interconnect connected between each two of adjacent ones of the multilayered circuit board units, each interconnect comprising a laminate having a first electrically conductive layer, a second electrically conductive layer and an intermediate layer between the first electrically conductive layer and the second electrically conductive layer, the first electrically conductive layer electrically connecting the first screening layers of said any two adjacent multilayered circuit board units, and the second electrically conductive layer linking the second rf screening layer of said any two adjacent ones of the multilayered circuit board units.

The present invention provides in yet another aspect a circuit board structure comprising three or more multilayered circuit board units, each of which comprises first and second outer screening layers and a circuit board located between the first and second outer screening layers and insulated therefrom, and an interconnect comprising a laminate having a first electrically conductive layer, a second electrically conductive layer and an intermediate layer between the first electrically conductive layer and the second electrically conductive layer, the first electrically conductive layer electrically connecting the first screening layers of at least three of said adjacent multilayered circuit board units and the second electrically conductive layer linking the second screening layer of at least three of said multilayered circuit board units.

Where three or more circuit board units are provided, a single interconnect can electrically connect the screening layers of all of the circuit board units, or selected ones thereof.

The present invention further provides in another aspect a circuit board structure comprising a plurality of multilayer circuit board units arranged in a stack, each circuit board unit comprising one or more circuit boards and upper and lower outer screening layers above and below and insulated from said one or more circuit boards such that a lower screening layer of one circuit board unit is in electrical contact with an upper screening layer of an adjacent circuit board unit, with the circuit boards being spaced from one another, and an interconnect external to said stack electrically connecting at least one set of adjacent ones of said upper and lower screening layers to other sets of adjacent screening layers.

The present invention further provides a circuit board structure comprising a plurality of multilayer circuit board units arranged in a stack, each circuit board unit comprising one or more circuit boards and upper and lower outer screening layers above and below and insulated from each of said one or more circuit boards, with a lower screening layer of one circuit board being in electrical contact with an upper screening layer of a circuit board immediately beneath said one circuit board, the circuit boards being arranged such that they form a stepped and/or overhanging arrangement at one end or side of the stack, and an electrically coupling interconnect that extends between an uppermost screening layer of the stack and a lowermost screening layer of the stack in electrical contact with exposed regions of the intervening screening layers of adjacent circuit board units.

The present invention further provides an interconnect for providing screening continuity between screening of adjacent circuit board units, each of which comprises first and second outer screening layers and a circuit board located therebetween and spaced apart and insulated therefrom, the interconnect comprising first and second conductive layers spaced apart by insulating material, the first conductive layer being arranged to provide an electrical connection between the first screens of the adjacent circuit boards and the second conductive layer being arranged to provide an electrical connection between the second screens of the adjacent circuit boards.

The insulating material which maintains the first and second conductive layers of the interconnect in spaced apart relationship may be formed as two or more separate strata of insulating material and, when so formed, can accommodate an electrically conductive strip or layer therebetween which can connect circuits or components of the circuit boards of adjacent units.

The present invention also provides a method of screening adjacent circuit boards from rf interference, the method comprising enclosing the circuit boards in electrically insulating material between upper and lower rf screens in a laminated arrangement, and electrically connecting a first planar interconnect between the upper screens and a second planar interconnect between the lower screens, each of the interconnects forming a continuous external surface with its respective screens.

The present invention also provides a method of screening adjacent circuit board units from rf interference, wherein each circuit board unit comprises a circuit board encapsulated by electrical insulation material and first and second electrically conductive screening layers with the encapsulated circuit board positioned therebetween, the method comprising the steps of:

providing an interconnect between the two circuit board units, the interconnect comprising a laminate itself comprising a first electrically conductive layer, a second electrically conductive layer and an intermediate electrically insulating layer between the first and second electrically conductive layers, electrically connecting the first electrically conductive layer of the interconnect to the first electrically conductive screening layer of each of the circuit board units, and electrically connecting the second electrically conductive layer of the interconnect to the second electrically conductive screening layer of each of the circuit board units, with no discontinuity between outer surfaces of the connected layers.

In each of the preferred arrangements and methods defined above in which circuit board units have both first and second outer screening layers, it is intended that such preferred embodiments of the present invention may be implemented using circuit board units at least one of which has only one outer screening layer, with corresponding adjustments being made to the interconnects linking the screening layers of such circuit board units.

BRIEF DESCRIPTION OF THE DRAWINGS

FIG. 3 is an isometric view of a first embodiment of the present invention in which two multilayer PCB units are electrically connected together;

FIG. 3A is a side view illustrating connection of a conductive layer of an interconnect with that of a PCB;

FIG. 4 is an isometric view of an interconnect for use in the first embodiment of the present invention shown in FIG. 1;

FIG. 8 is an isometric view of a fourth embodiment of the present invention, showing three stacked PCB units of different dimensions electrically connected;

FIG. 9 is an isometric view illustrating a variation of the embodiment shown in FIG. 8;

DETAILED DESCRIPTION

Figure 2:
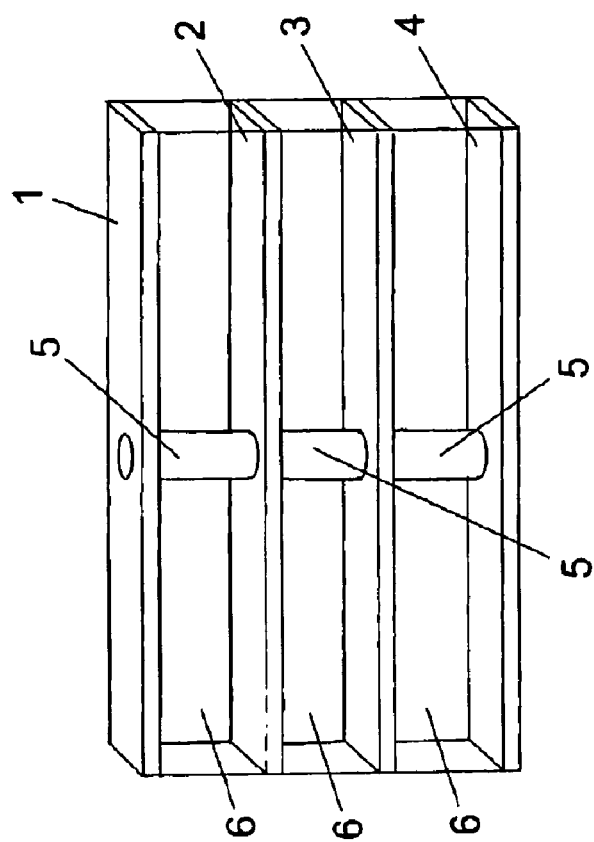
FIG. 2 is an isometric view of an arrangement of two PCB structures, each comprising a plurality of multilayer PCB units in a stacked arrangement.
Figure 1:
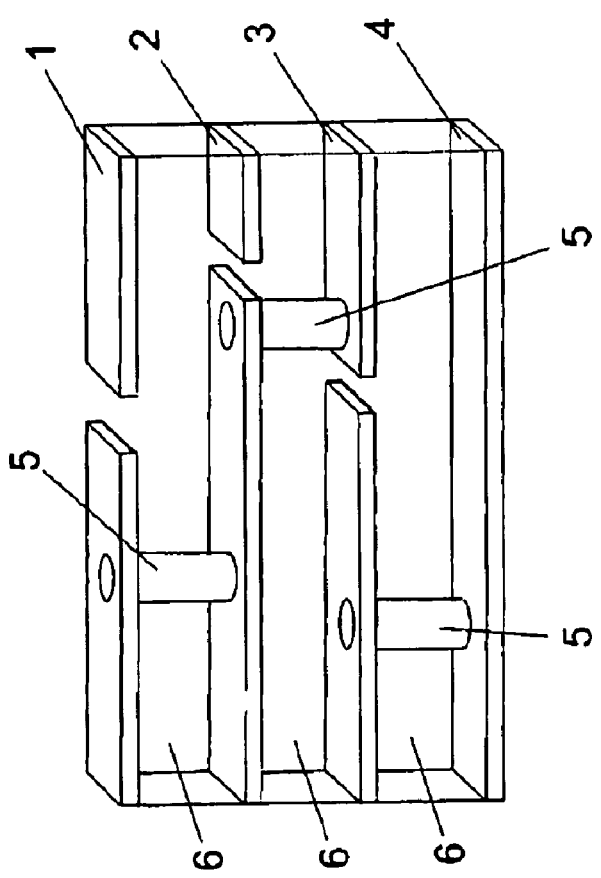
FIG. 1 is an isometric view of an arrangement of two PCB structures, each comprising a plurality of multilayer PCB units in a stacked arrangement.

The following description of preferred embodiments of the present invention makes reference to circuit boards made using printed circuit techniques, hence printed circuit boards (PCBs). However, all references to printed circuit boards (PCBs) are intended to include reference to circuits formed in conductive layers other than those manufactured specifically using printed circuit techniques. For example, a reference to a PCB in the following description and drawings is intended to include a reference to circuits fabricated using semiconductor materials and the like.

There now follows a detailed description which is to be read with reference to FIGS. 3 to 9 of the accompanying drawings of a number of embodiments of the present invention which have been selected for description to illustrate the invention by way of example.

Referring to FIG. 3, there is illustrated a printed circuit board (PCB) structure, generally indicated at 10, of two connected multilayered PCB units provided by a first such PCB unit 12 and a second such PCB unit 14. The two units 12 and 14 are held in spaced parallel relationship as shown and any suitable spacing means for so doing may be used. (It will of course be understood that the two PCB units may alternatively simply be stacked one directly on top of the other.)

Each PCB unit 12 and 14 preferably comprises a first outer screening layer 16 and a second outer screening layer 18, and, between the two screening layers, a printed circuit board 20 carrying electrical circuits (not shown).

The two screening layers are provided to screen the electrical circuits from stray radio frequency signals. Between the PCB 20 and each of the screening layers 16 and 18, a layer of insulation 22 is provided to insulate the PCB 20 from the screening layers 16, 18 and to protect the circuit components and conductive connections on the PCB. The screening layers 16, 18 may take the form of continuous sheets of conductor or they may be formed as a periodic pattern of conducting elements, in particular in the vicinity of interconnections between PCBs, to help to suppress parallel plate modes that may otherwise exist between layers during operation. The insulating layers 22 may be formed using a solid dielectric material or they may be formed using a dielectric material having a foam or a honeycomb structure to help to reduce losses at higher frequencies that may otherwise arise with solid dielectrics.

As shown in FIG. 3, the two PCB units 12, 14 are formed with tab portions 26, 28 respectively at one side and adjacent one corner of the unit. The two tab portions 26, 28 are provided at opposite corners of their respective PCB units and on the same side so that they face one another.

Between facing end surfaces 30, 32 of the two tab portions 26, 28 extends an interconnect 34 which provides a bridge between the tab portions. This interconnect 34 is formed as a laminate and has end faces shaped so that, when mounted in an inclined position such as shown in FIG. 3, they can mate with the end faces 30, 32 of the tab portions 26, 28 of the two PCB units 12, 14, as hereinafter described.

The interconnect 34 comprises first and second electrically-conductive layers 36, 38, formed of conductive material such as sheet metal, with an intermediate layer 40 between the two layers 36, 38. The intermediate layer 40 is provided by two layers of insulating spacing material 42, 43 and a further conductive layer 45 sandwiched therebetween, the purpose of which is described below. The spatial separation between the three layers 36 and 45, and 45 and 38 is such that, allowing for the angle of inclination of the interconnect 34 relative to the two PCB units 12 and 14, the end faces of the five layers 36, 42, 45, 43 and 38 are aligned with end faces of the five layers 16, 22, 20, 24 and 18 respectively of the tab portions. The alignment of the end faces 30, 32 of the tab portions with the mating end faces of the interconnect is such that the end faces of the pairs of facing layers 16, 36; 20, 45; 18, 38 are in abutting or overlapping contact to provide an electrical connection therebetween. The end faces of the three conductive layers can then be bonded in position by means of solder, a solder-based adhesive composition or other electrically-conductive adhesive composition. Suitable adhesive compositions include epoxy resins containing an electrically conductive filler such as tin, silver or carbon, and silicone-based conductive adhesive compositions. Other polymers such as acrylate polymers and copolymers may also be used in conjunction with Ag, Au or similar conductive filler material; these latter adhesives may be curable very quickly by use of UV curing techniques for example. Alternatively, anisotropically conductive adhesives may also be used.

When the interconnect is bonded in position, it is highly desirable that a smooth surface of each of the layers 36, 38 and the corresponding adjacent outer surfaces of the respective layers 16, 18 of the two units 12, 14 is developed to avoid discontinuities that may give rise to noise or crosstalk.

It is to be understood that whereas PCB units may have both first and second outer screening layers 16, 18, preferred embodiments of the present invention may be implemented using PCB units having only one outer screening layer with corresponding adjustments being made to provide interconnects 34 having only one electrically conductive layer for interconnecting the outer screening layer of two or more such PCB units. It will also be understood that a mixture of one and two screen PCB units may be provided in a PCB structure and interconnected with appropriate interconnects defined according to preferred embodiments of the present invention described herein.

In FIG. 4 is shown one example of the manner in which one end of an interconnect 34 according to the present invention can be connected electrically either to a tab portion of a PCB, such as tab portion 26, 28 of the structure shown in FIG. 3 or, where the interconnect 34 is itself formed as a plurality of segments, the manner in which one such segment can be connected to another. As shown in FIG. 4, the interconnect 34 is of two-part construction in which one segment 34a is to be connected to a second segment 34b. It will however be readily understood that the same approach is to be adopted where either part, or segment, represents an edge portion of a PCB unit to which the interconnect 34 is to be electrically connected.

An end portion 35 of the interconnect segment 34a is formed such that the intermediate layer 40a is undercut from the top screening layer 36a and the intermediate layer 40a is itself undercut at a level where a conductive strip (not shown) corresponding to the layer 45 of the FIG. 3 embodiment extends through the segment 34a and is exposed at the undersurface of the extension 40b of the intermediate layer 40a. Corresponding end portion 37 of the interconnect segment 34b is complimentarily formed in a stepped shape to expose a portion of the lower second outer conductive layer 38a and to expose a further conductive strip 45a which, when the two segments are brought together, can make electrical contact with the corresponding strip in the segment 34a. The two strips can be bonded together for example by a solder or by an electrically conductive adhesive composition. Similarly, the outer conductive layers can also be brought into electrical contact by bonding the respective layers together.

The interconnect 34, or one segment 34a, 34b of the interconnect 34, may be formed as part of PCB unit 12, 14 during fabrication, lying initially within the plane of the PCB unit 12, 14. A laser forming and annealing technique may then be used to cause the interconnect 34 or interconnect segment 34a, 34b to bend to the angle required. This technique avoids the need to bond the interconnect 34 to at least one of the PCB units 12, 14. If, instead of using printed circuit techniques, the PCB units 12, 14 comprise circuit boards fabricated using semiconductor materials and techniques, then the interconnect 34 or segments 34a, 34b thereof may be fabricated using similar techniques, or micro-machined from a semiconductor substrate as required.

Whereas the arrangement shown in FIG. 4 has been described for use in connecting the ends of the interconnect segment to tab portions of PCB units, it may be used equally well either to connect multiple segments within the interconnect itself or to make a connection to a further intermediate PCB unit at a point other than at the ends of the interconnect.

As previously mentioned, it has been found advantageous to avoid fold lines and creases at the juncture of the interconnect surfaces with those of the PCB units, and so the interconnect may be formed to provide curved layers that could be aligned with the outer screening layers of the PCB units so that the outer surfaces thereof can be continuous with the outer surfaces of the respective outer screening layers of the PCB units, as shown in FIG. 3A. To permit provision of curved surfaces by the interconnect, the conductive layers of the interconnect and the strata providing the intermediate layer, and also the conductive strip or layer embedded therein may be provided by flexible materials, or by materials that can be rendered flexible by the application of heat.

Figure 5:
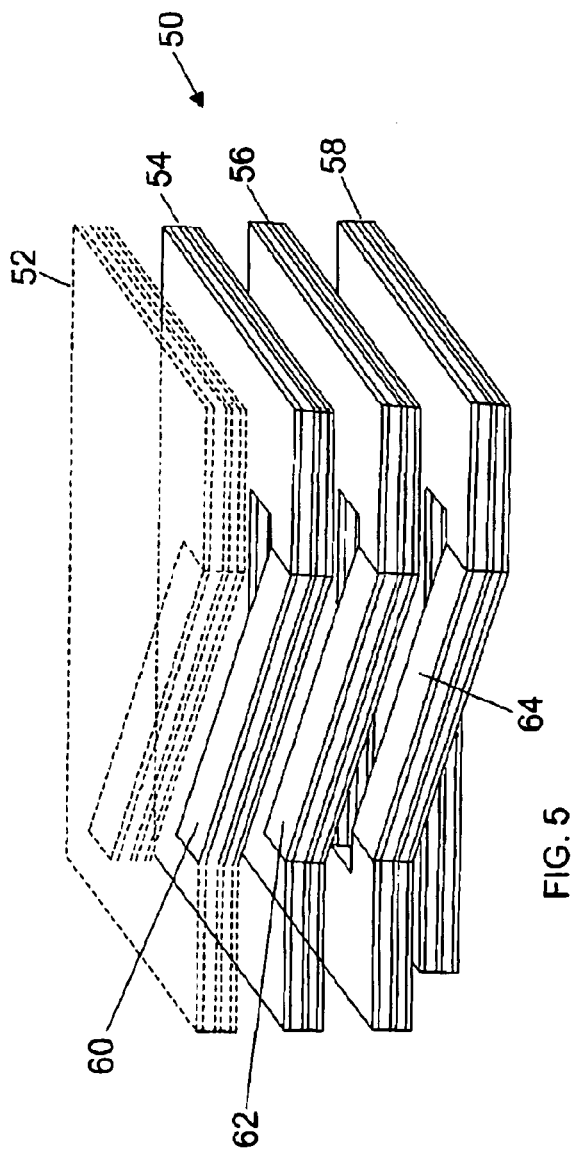
FIG. 5 is an isometric view of a second embodiment of the present invention, illustrating the manner in which four multilayer PCB units are electrically connected together.

Referring now to FIG. 5, there is shown therein a PCB structure which is similar to that shown in FIG. 3 but which comprises a stack 50 of four spaced-apart PCB units 52, 54, 56, 58 adjacent ones of which are electrically connected together by interconnects 60, 62, 64 which are of similar construction to the interconnect 34 of FIG. 3. The structure of the PCB units themselves is also similar to the PCB units 12, 14 of FIG. 3. Neither the PCB units nor the interconnect of FIG. 5 will therefore be further described. However, it will be appreciated from the disclosure of FIG. 5 that a structure such as is shown therein may consist of more than four PCB units.

Figure 6:
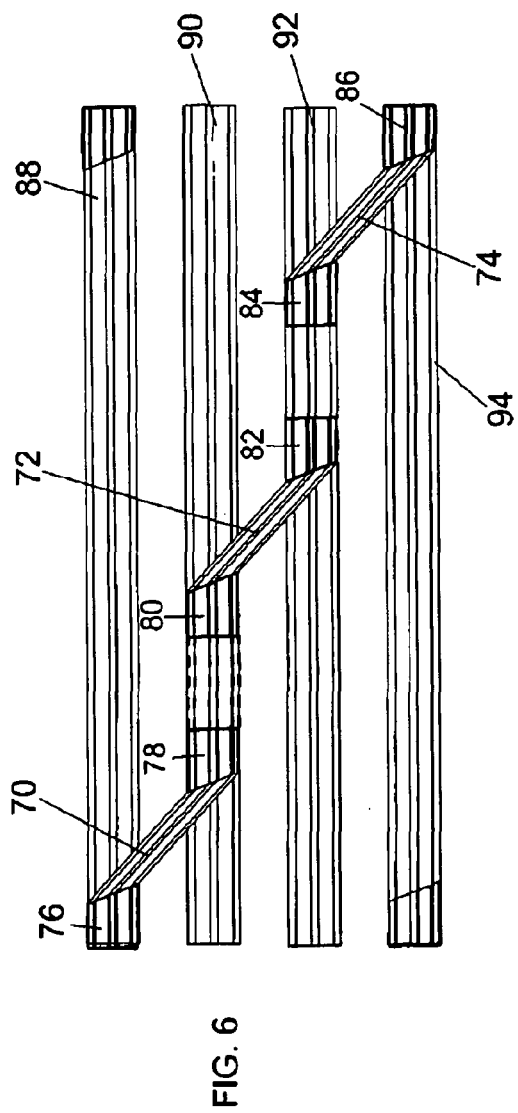
FIG. 6 is a side elevation of a third embodiment of the present invention, illustrating a further arrangement for electrically connecting four multilayer PCB units together.

FIG. 6 illustrates a further alternative embodiment of the present invention, in which interconnects 70, 72, 74 are positioned between opposed pairs of tab portions 76, 78; 80, 82; 84, 86 on adjacent PCB units 88, 90, 92, 94. The tab portions 78, 80 and 82, 84 may be formed as a single tab portion as indicated by the dotted line extending between tab portions 78, 80. the structure of the PCB units and of the interconnects is similar to that of the embodiment shown in FIGS. 3 and 5 and will therefore not be further described.

Figure 7:
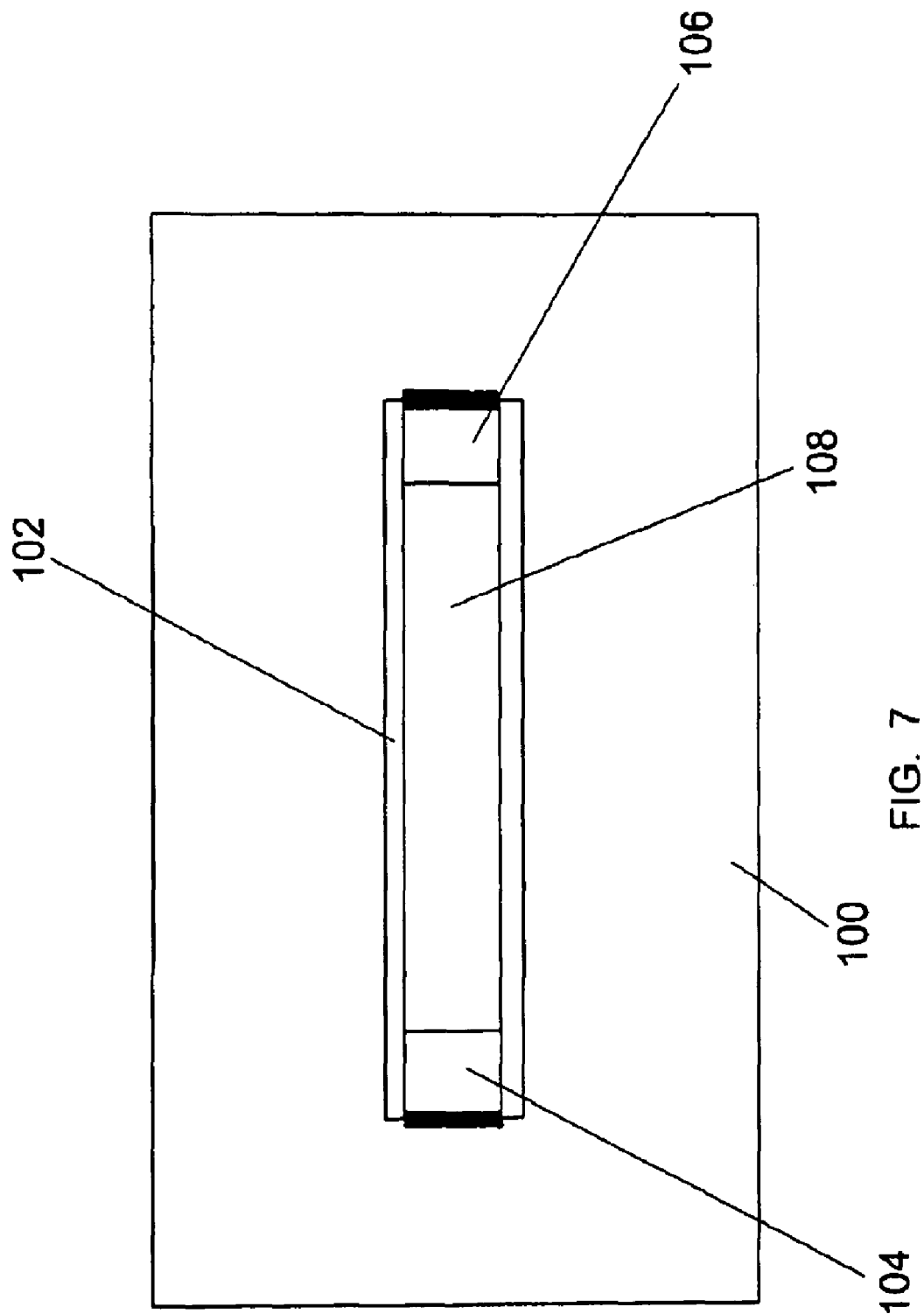
FIG. 7 is a plan schematic view of a variation of the embodiments of the present invention that are illustrated in FIGS. 3 and 5.

In FIG. 7 is shown a variant of the embodiments of the invention that are illustrated in FIGS. 3 and 5. A PCB unit is shown generically at 100, the PCB unit having an elongate aperture 102 formed therein. the PCB unit 100 is formed with a tab portion 104 extending into the aperture 102, and a similar PCB unit (not shown but positioned below or behind the PCB unit 100) is similarly formed and provided with an opposed tab portion 106. Extending between the upper tab portion 104 and the lower, opposed tab portion 106 is an interconnect 108.

The structure of the PCB unit and of the interconnect 108 is similar to that described with reference to the preceding FIGS. 3 to 6 and will not be further described. It will be appreciated that the construction shown in FIG. 7 is especially suited for use in structures where it may be subject to rough handling in instrumentation which is designed for use in rugged conditions.

Referring now to FIG. 8, there is shown therein an embodiment of the invention that is particularly useful with PCB units that are of a different size one from the other. As shown in FIG. 8, three PCB units 110, 112 and 114 are stacked one upon the other, though of course they may be in spaced relationship to each other. It is also to be clearly understood that the arrangement of the PCB units may be inverted from that shown in FIG. 8 or may be re-arranged such that the shortest PCB unit 110 is located between the other two. It is also to be understood that the construction of each PCB unit is substantially similar to that shown and described with reference to FIGS. 3 to 7. Thus, PCB unit 110 has an upper screening layer 116 exposed while only portions only of the upper screening layers 118, 120 of the PCB units are exposed.

The screening layers 116, 118, 120 can be electrically connected by positioning electrically conductive material 122 at the end face of each of PCB units 110, 112 and 114. The electrically conductive material 122 is deposited, for example by plating, as a conductive adhesive or bonded to the edges of the adjacent screening layers 116, 118 and 118, 120 in the same manner as described above with reference to the embodiment disclosed in FIG. 3, i.e. by use of solder, an electrically-conductive epoxy resin or the like.

Alternatively, as shown in FIG. 9 a single length 124 of screening material may extend along the length of the screening layer 116, down the end face of the PCB unit 110, along the exposed portion of screening layer 118, down the front face of the PCB unit 112 and along the exposed portion of screening layer 120 of PCB unit 114, being bonded to the screening layers in the manner described above.

Turning now to FIGS. 10, 11, 12 and 13, there is shown, in each Figure, a PCB structure which comprises a stack of six PCB units 132. In both of these embodiments of the invention, a means of electrically connecting electrically conductive layers which are within the body of a stack of PCB units is shown.

In all four embodiments, the adjacent screening layers 132 of the uppermost pairs of PCB units and of the lowermost pairs of PCB units of the stack are electrically connected.

Figure 10:
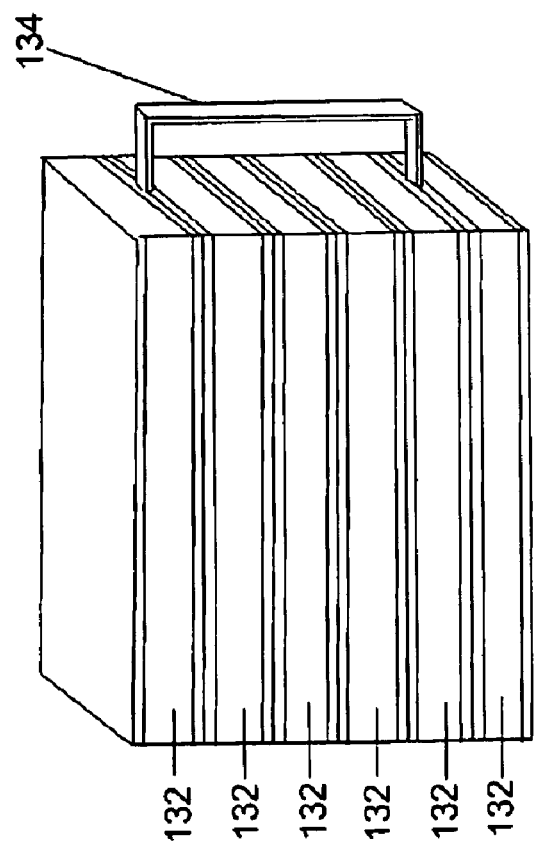
FIG. 10 is an isometric view of a fifth embodiment of the present invention.

In the embodiment of FIG. 10, this is achieved by a shaped electrically-conductive interconnect 134 that is bonded to one or both of the screening layers of any adjacent or non-adjacent pair of PCB units using an adhesive composition as described above, care being taken to ensure that the bonding adhesive composition forms a smooth continuous surface with surfaces of the screening layer(s) and with immediately adjacent surfaces of the interconnect.

Figure 11:
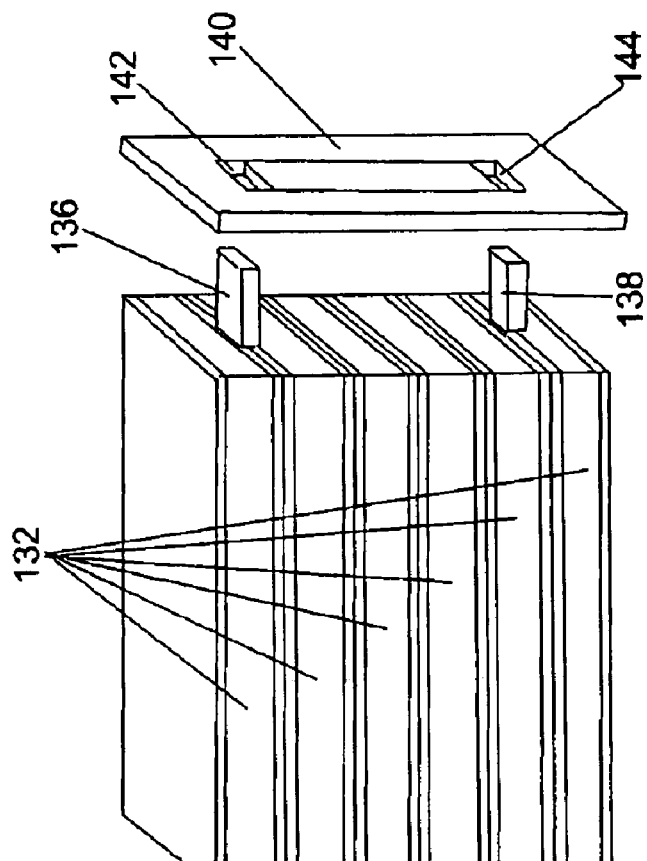
FIG. 11 is an isometric view of a sixth embodiment of the present invention.

In the embodiment of FIG. 11, electrical connection of the layers of any adjacent or non-adjacent uppermost and lowermost pair of PCB units 132 is achieved by bonding separate interconnects 136, 138 to one or both of the layers of each pair and joining the two interconnects 136, 138 with a bridging interconnect member 140 which may be a continuous electrically conductive material or a patterned electrically conductive material supported by an electrically insulating material. The interconnect member 140 is provided with spaced-apart apertures 142, 144 arranged to receive the interconnect 136, 138 which can be bonded in situ to the member 140.

It will be readily appreciated that there may be any number of separate interconnects on any wall of the stack and that the area of the interconnect member 140 can be of any convenient shape or size.

Figure 12:
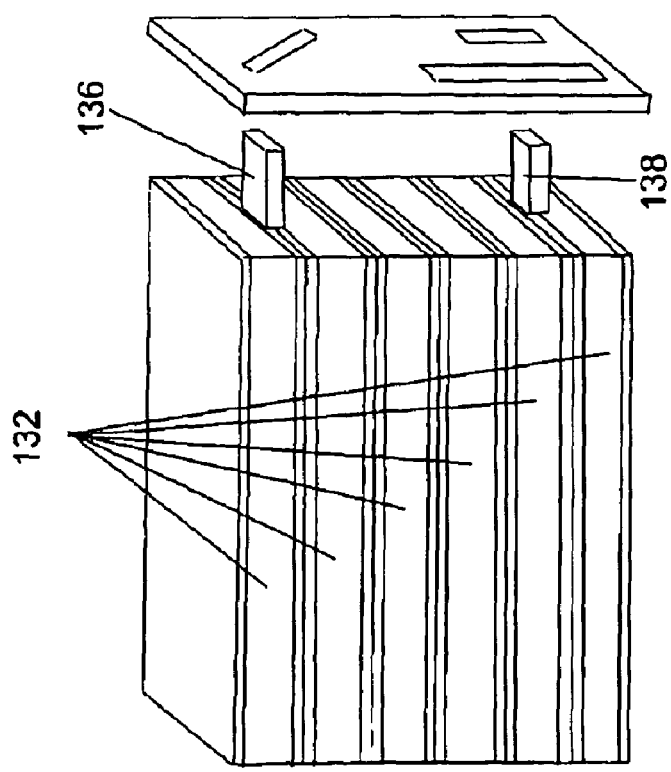
FIG. 12 is an isometric view of a seventh embodiment of the present invention.

In the embodiment of FIG. 12, the electrical connections are shaped so as to connect any desired combination of conductors within the stack. It will be readily appreciated that this is another means to effect shaped interconnections similar to those shown in FIGS. 3, 5 and 6.

Figure 13:
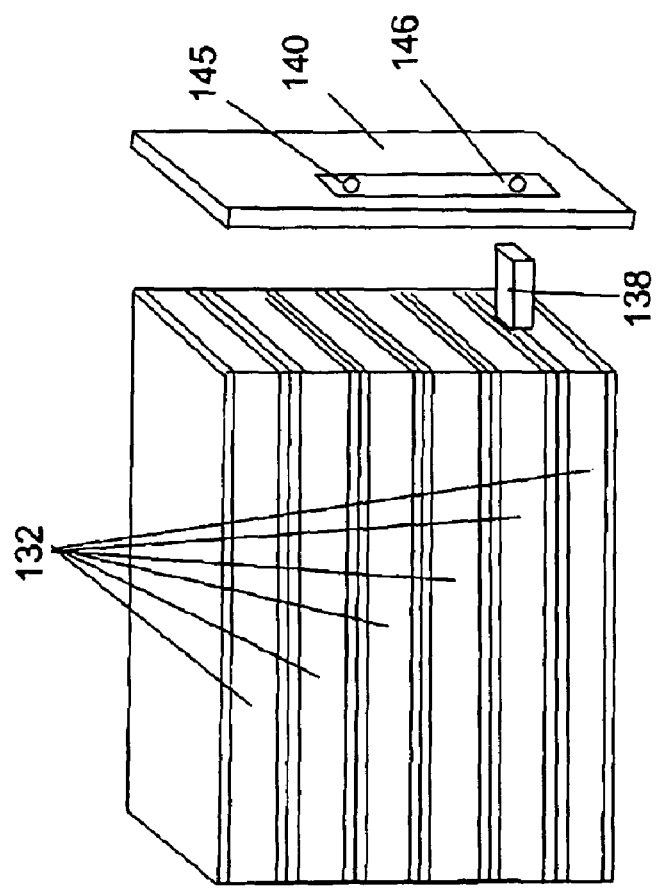
FIG. 13 is an isometric view of an eighth embodiment of the present invention.

In the embodiment of FIG. 13, electrical connection of the layers is achieved by an interconnect member 140 which is provided with spaced-apart apertures 145 and 146 arranged to lie adjacent to the conductive material at the edges of the PCB units and, after bonding the electrically-insulating material 139, applying conductive material to the apertures 145 and 146 so as to make electrical connection between the electrical conductors on the interconnect member 140 and those within the stack, as for 20 in FIG. 3. It will be readily appreciated that the electrical connection may be made using electrically conductive adhesive or by a plating technique as known in the art and as used for what are known as "plated-through-holes" or "vias".

In any of the embodiments 10, 11, 12 and 13, the interconnection member 140 can also include a separate electrically conductive layer so as to provide a connection with controlled characteristic impedance. The patterns may be on the same layer, so as to form what is known as a co-planar waveguide, or on one or more parallel surfaces so as to form either microstrip or tri-plate.

The invention claimed is:

1. A circuit board structure, comprising:
  a first multilayered circuit board unit;
  a second multilayered circuit board unit aligned along respective edge portions with the first multilayered circuit board, each multilayered circuit board unit including a first outer radio frequency (RF) screening layer and a layer including a circuit board; and
  an interconnect, extending alongside and spaced apart from said edge portions, at least part of which is formed separately from the first and second circuit board units, providing an electrical connection between the first and second circuit board units, the interconnect including a laminate having a first electrically conductive layer and a further layer, the first electrically conductive layer electrically connecting the first outer RF screening layer of each of the first and second multilayered circuit board units; and
  wherein each of the first multilayered circuit board unit and the second multilayered circuit board unit includes a second outer screening layer such that the layer including a circuit board is disposed between the first outer screening layer and the second outer screening layer,
  wherein the interconnect is a laminate including a second electrically conductive layer such that the further layer forms an intermediate layer disposed between the first electrically conductive layer and the second electrically conductive layer, and
  wherein the second electrically conductive layer electrically connects the second outer screening layer of each of the first multilayered circuit board unit and the second multilayered circuit board unit.

2. A circuit board structure according to claim 1, wherein the further layer includes an electrical connection for electrically connecting the circuit boards of the first and second circuit board units.

3. A circuit board structure according to claim 2, wherein the electrical connection is provided by an electrically conductive strip or layer mounted on or within the further layer.

4. A circuit board structure according to claim 1, wherein the first layer of the interconnect is of planar form and forms a continuous conductive surface with the outer surface of the first outer screening layer that is uninterrupted by fold lines or creasing.

5. A circuit board structure according to claim 1, wherein the first circuit board unit is superimposed over the second circuit board unit and the interconnect is bonded to the first and second circuit board units.

6. A circuit board structure according to claim 5, wherein the first and second circuit board units are arranged in side by side relationship.

7. A circuit board structure according to claim 1, wherein each of the first and second circuit board units comprises a tab portion, the tab portions of the two circuit board units being at opposite end regions of their respective edge portions and the interconnect extending between the tab portions.

8. A circuit board structure according to claim 7, wherein the interconnect is formed as a ramp extending between the two tab portions.

9. A circuit board structure according to claim 1, wherein each circuit board unit is formed with an aperture or recess therein, the apertures or recesses being aligned by their edge portions, and each circuit board is provided with a tab portion within and each the respective aperture or recess that is opposite to the tab portion provided between the aperture or recess of the adjacent circuit board unit so that the interconnect can extend from one tab portion to the other within the aligned apertures or recesses.

10. A circuit board structure according to claim 1, wherein the interconnect is curved and the layers of the interconnect are curved or bent to align the first electrically conductive layer with the first outer screening layers of the circuit board units to form an interconnecting conductive surface that is uninterrupted by fold lines or creasing.

11. A circuit board structure according to claim 1, wherein the layers of the interconnect are formed of flexible material or of material that can be rendered flexible by application of heat to curve or bend the interconnect into a required shape.

12. A circuit board structure according to claim 1, wherein the interconnect is formed as a plurality of interconnect segments that can be connected together to form an integral interconnect.

13. A circuit board structure according to claim 1, wherein the interconnect is bonded by a bonding agent to the first and second circuit board units such that the first layer of the interconnect is electrically connected to the first outer screening layer of the first and second circuit board units, the bonding agent being electrically conductive and being selected from a material including solder, a solder based material or electrically conductive epoxy resin.

14. A circuit board structure according to claim 1, wherein the first layer of the interconnect is electrically connected to the first outer screening layer of the first and second circuit board units by electrically conductive adhesive tape.

15. A circuit board structure according to claim 1, wherein the further layer includes an electrical connection for electrically connecting the circuit boards of the first and second circuit board units, and wherein the intermediate layer is formed as two strata of insulating material and the electrical connection is provided between the two strata.

16. A circuit board structure, comprising:
  three or more spaced apart multilayered circuit board units, each of which includes first and second outer screening layers and a circuit board located between the first and second outer screening layers and insulated therefrom; and
  an interconnect connected between any two of the circuit board units, the interconnect including a laminate having a first electrically conductive layer, a second electrically conductive layer and an intermediate layer between the first electrically conductive layer and the second electrically conductive layer, the first electrically conductive layer electrically connecting the first outer screening layers of said any two circuit board units, and the second electrically conductive layer linking the second outer screening layers of said any two circuit board units.

17. A circuit board structure, comprising:

three or more multilayered circuit board units, each of which includes first and second outer screening layers and a circuit board located between the first and second outer screening layers and insulated therefrom, and an interconnect including a laminate having a first electrically conductive layer, a second electrically conductive layer and an intermediate layer between the first electrically conductive layer and the second electrically conductive layer, the first electrically conductive layer electrically connecting the first screening layers of at least three of said multilayered circuit board units, and the second electrically conductive layer linking the second screening layer of said at least three of said multilayered circuit board units.

18. A circuit board structure according to claim 17 wherein the interconnect electrically connects the screening layers of all of the spaced apart multilayered circuit board units.

19. A circuit board structure, comprising:

a plurality of multilayer circuit board units arranged in a stack, each circuit board unit including one or more circuit boards and upper and lower outer screening layers above and below and insulated from said one or more circuit boards such that a lower screening layer of one circuit board unit is in electrical contact with an upper screening layer of an adjacent circuit board unit, with the circuit boards being spaced from one another, and an interconnect external to said stack electrically connecting at least one set of adjacent ones of said upper and lower screening layers to other sets of adjacent screening layers.

* * * * *